United States Patent
Atehortua et al.

(10) Patent No.: US 7,429,436 B2
(45) Date of Patent: Sep. 30, 2008

(54) METHOD FOR DETERMINING STATE OF CHARGE OF LEAD-ACID BATTERIES OF VARIOUS SPECIFIC GRAVITIES

(75) Inventors: Hector M. Atehortua, North Bergen, NJ (US); Steven Hoenig, Staten Island, NY (US); Thirumalai G. Palanisamy, Morristown, NJ (US); Harmohan N. Singh, Rockaway, NJ (US)

(73) Assignee: Honeywell International Inc., Morristown, NJ (US)

( * ) Notice: Subject to any disclaimer, the term of this patent is extended or adjusted under 35 U.S.C. 154(b) by 315 days.

(21) Appl. No.: 11/046,228

(22) Filed: Jan. 31, 2005

(65) Prior Publication Data

US 2006/0170426 A1    Aug. 3, 2006

(51) Int. Cl.
    *H01M 6/14* (2006.01)
(52) U.S. Cl. .................. 429/302; 320/132; 320/137; 320/151
(58) Field of Classification Search .............. 429/302; 320/132, 137, 151
    See application file for complete search history.

(56) References Cited

U.S. PATENT DOCUMENTS

| 3,684,273 | A | | 8/1972 | Bensen et al. |
| 4,626,765 | A | * | 12/1986 | Tanaka ..................... 320/127 |
| 4,719,427 | A | | 1/1988 | Morishita et al. |
| 5,049,803 | A | | 9/1991 | Palanisamy |
| 5,381,096 | A | | 1/1995 | Hirzel |
| 6,366,054 | B1 | * | 4/2002 | Hoenig et al. ............... 320/132 |
| 6,380,716 | B1 | | 4/2002 | Finger |
| 2002/0193953 | A1 | | 12/2002 | Hoenig et al. |
| 2005/0270033 | A1 | | 12/2005 | Singh et al. |

* cited by examiner

*Primary Examiner*—Jane Rhee
(74) *Attorney, Agent, or Firm*—Oral Caglar, Esq.

(57) ABSTRACT

In accordance with various embodiments, there is a method for determining the state of charge of a battery. Various embodiments include the steps of determining the specific gravity of the battery and measuring an open circuit voltage of the battery at rest. The open circuit voltage at rest can be used to determine the battery state of charge from a correlation function dependent on the battery specific gravity.

12 Claims, 4 Drawing Sheets

METHOD FOR DETERMINING STATE OF CHARGE OF LEAD-ACID BATTERIES OF VARIOUS SPECIFIC GRAVITIES

FIELD OF THE INVENTION

The invention generally relates to methods and apparatus for determining the state of charge of a battery and, more particularly to methods and apparatus for determining the state of charge of batteries with various specific gravities.

BACKGROUND OF THE INVENTION

It is often desirable to determine a battery's state of charge (SOC) for diagnostic functions and development of satisfactory charging regimes. The SOC is expressed as a percentage of the total energy, usually expressed in amp-hours (Ah), storable in the battery when the battery is fully charged. For example, a battery capable of storing 100 Ah when it is fully charged will have 75 Ah remaining when the SOC is 75%.

A conventional method for determining the SOC of a battery, such as a lead-acid battery, uses a measurement of an open circuit voltage (OCV) as a state of charge indicator. Generally, the OCV refers to the potential difference across the battery terminals with no load on the battery. As the battery discharges, the potential difference between the terminals drops. Using this method, conventional lead-acid battery analyzers measure the decrease in OCV from a full charge OCV to determine the battery's SOC.

The OCV of a battery is also related to a specific gravity (SG) of the battery's electrolyte. Specific gravity of the battery refers to a ratio of the density of the battery's electrolyte to the density of water. For example, a flooded cell lead-acid battery with six cells and a full charge specific gravity of 1.28 typically has a full charge OCV of 12.7 volts (V). Problems arise because conventional methods and apparatus do not take into account recently introduced lead-acid batteries having a sulfuric acid electrolyte with a full charge specific gravity of 1.30. These higher specific gravity lead-acid batteries generally have a full charge OCV of 13 V. Because the conventional methods and apparatus for determining SOC cannot distinguish between the lower specific gravity batteries (1.28 SG) and the higher specific gravity batteries (1.30 SG), incorrect SOC determination results when using the higher specific gravity batteries with conventional methods and apparatus.

Thus, there is a need to overcome these and other problems of the prior art and to provide better methodology and apparatus to determine battery SOC.

SUMMARY OF THE INVENTION

In accordance with various embodiments, there is a method for determining the SOC of a lead-acid battery including determining a specific gravity of a lead-acid battery. The open circuit voltage of the lead-acid battery at a rested state can be determined. The SOC of the lead-acid battery can then be determined from the open circuit voltage using a correlation function, wherein the correlation function depends on the specific gravity of the lead-acid battery.

In accordance with various embodiments, there is an apparatus for determining a state of charge (SOC) of a lead-acid battery including a power supply and a control module. The control module includes an analog-to-digital converter, a digital-to-analog converter, and an electronics control system, wherein the control module controls the power supply to apply a current to a battery. The apparatus further includes a control relay electrically connected to the power supply and a sensor that detects at least one of a battery voltage response to a current ramp and an open circuit voltage at a rested state, where the sensor electrically connected to the control relay. The apparatus further includes a processor configured to determine a specific gravity of the battery based on a maximum battery voltage detected in the battery voltage response and configured to determine the SOC of the lead-acid battery based on the rested state open circuit voltage and the specific gravity of the lead-acid battery.

In accordance with various embodiments, there is a computer readable medium for determining a state of charge of a battery. The computer readable medium includes program code for applying a current to a battery at a rested state and program code for measuring an open circuit voltage in response to the current. The computer readable medium also includes program code for determining the state of charge from the open circuit voltage and a correlation function, wherein the correlation function depends on the specific gravity of the lead-acid battery.

It is to be understood that both the foregoing general description and the following detailed description are exemplary and explanatory only and are not restrictive of the invention, as claimed.

The accompanying drawings, which are incorporated in and constitute a part of this specification, illustrate several embodiments and together with the description, serve to explain the principles of the invention.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

FIGS. 1-4 disclose, generally, apparatus and methods for determining the SOC of a battery.

Figure 1:
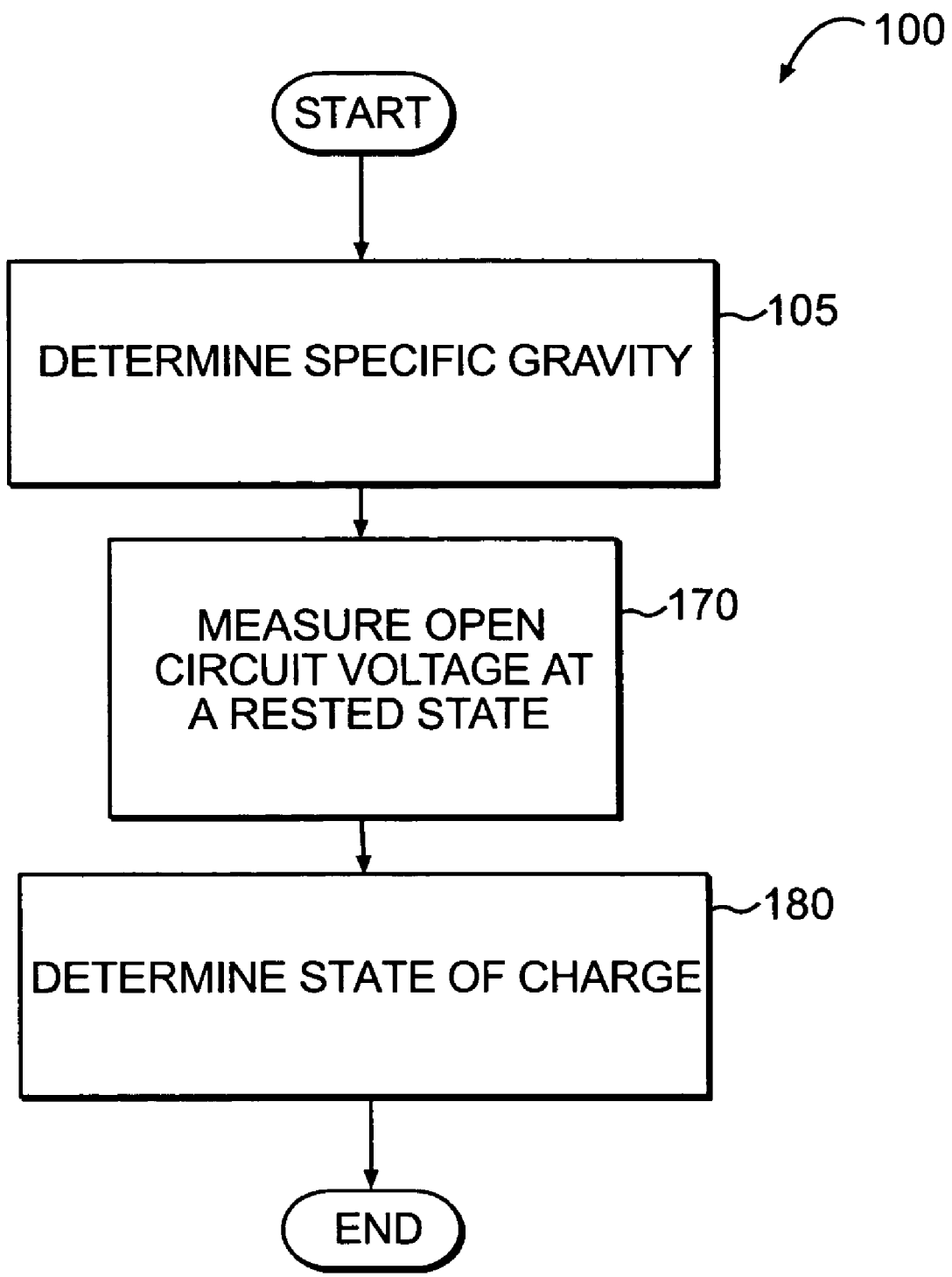
FIG. 1 depicts a flow chart of a method capable of determining the state of charge of a battery in accordance with exemplary embodiments of the present teachings.

FIG. 1 depicts a flow chart of an exemplary method 100 for determining a SOC of a battery. In 105, a specific gravity (SG) of the battery can be determined. As used herein, the terms "specific gravity" and "battery specific gravity" refer to the specific gravity of the electrolyte of the battery. The specific gravity of the battery can be determined by invasive techniques, such as, for example, extracting a sample of electrolyte from the battery. The specific gravity can also be determined by examining documentation on the battery's specifications.

Figure 2:
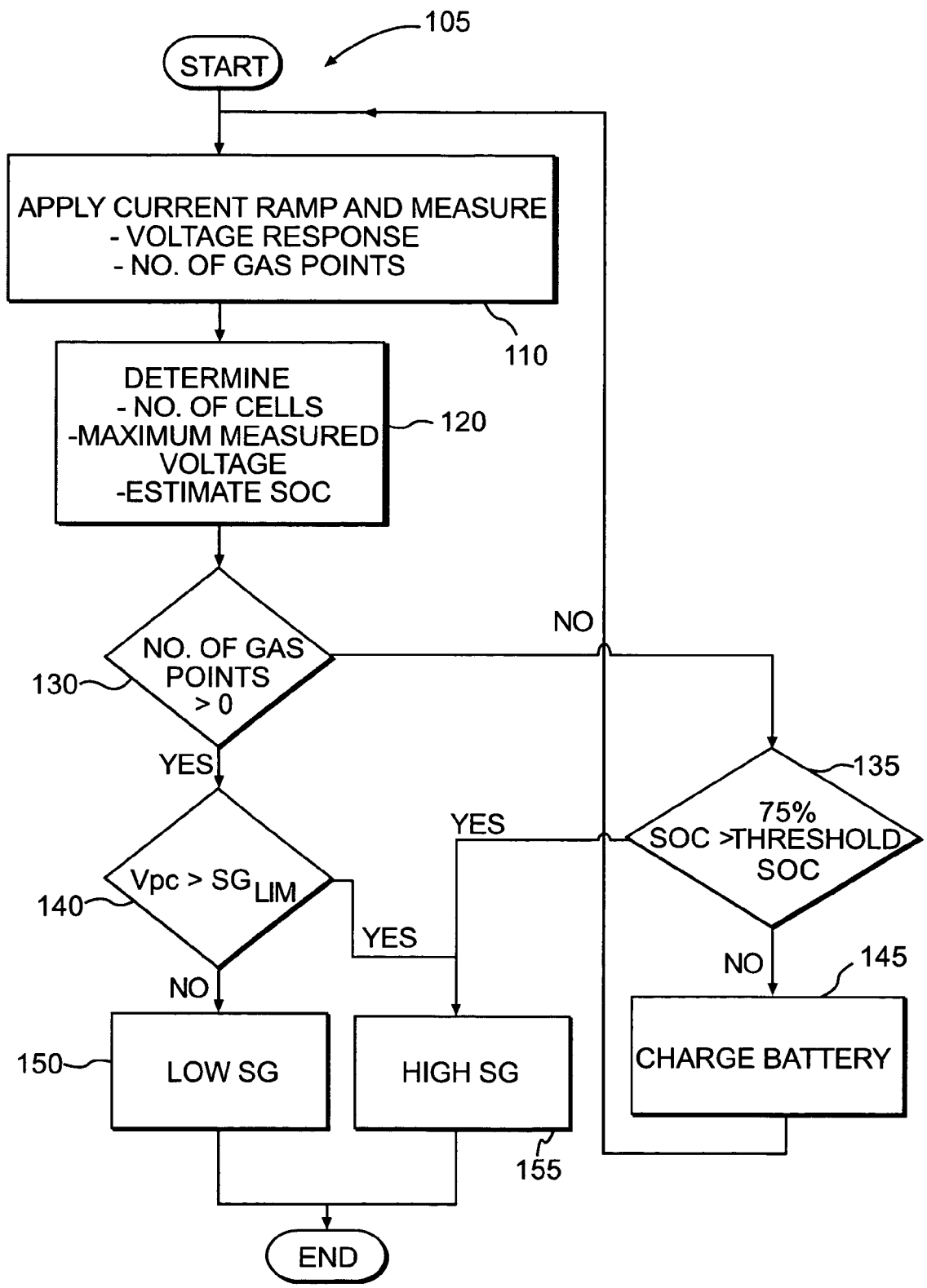
FIG. 2 depicts a flow chart of a method capable of determining the specific gravity of a battery in accordance with exemplary embodiments of the present teachings.

According to various embodiments, the battery specific gravity can be determined non-invasively, as disclosed, for example, in U.S. patent application Ser. No. 10/860,315, filed on Jun. 4, 2004, and incorporated by reference in its entirety herein. Referring to FIG. 2, a current ramp can be applied to the battery in 110, such as, for example, a lead-acid battery having a plurality of cells, while measuring battery voltage at the battery terminals. In various embodiments, the current ramp can begin at zero current and can be linearly increased to a predetermined limit and then linearly decreased at a same slope until the current is zero. The absolute value of the decreasing slope can be the same as the absolute value of the increasing slope. The number of gas points can also be measured during application of the current ramp. A gas point occurs when the applied current causes hydrogen gas and oxygen gas to be generated from water in the electrolyte within a cell. These gasses can be detected using methods known to one of skill in the art.

In 120, several battery parameters can be determined in order to calculate a maximum voltage per cell ($V_{pc}$). A number of cells of the battery can be determined by various methods known to one of skill in the art. For example, the number of cells of the battery is generally provided by the battery specification. A maximum measured voltage of the battery in response to the current ramp of 110 can also be determined. The $V_{pc}$ can be calculated by dividing the maximum measured battery voltage by the number of cells of the battery.

An SOC can also be estimated in 120 using algorithms known to one of skill in the art. For example, a single cell lead-acid battery has an open circuit voltage (OCV) that varies from about 2.0 to about 2.2 V as its SOC increases from 0% to 100%. The SOC can be estimated by the following equation:

$$SOC = (OCV_m - OCV_{min}) \times 100 / (OCV_{max} - OCV_{min}),$$

where $OCV_m$ is the measured OCV, $OCV_{min}$ is the OCV at 0% SOC, and $OCV_{max}$ is the OCV at 100% SOC.

Because the battery's SG is unknown at this point, a default algorithm using a battery having either the higher SG or the lower SG can be used. The specific algorithm can reflect the typical battery type tested by a user. For example, a lower SG (1.28) flooded cell lead-acid battery having 6 cells, has an $OCV_{min}$ of about 11.5 V and an $OCV_{max}$ of about 12.7 V.

In 130, the number of gas points determined in 110, affects the analytical methodology. If the number of gas points is greater than 0, the maximum voltage per cell ($V_{pc}$) can be compared to an $SG_{Lim}$. $SG_{Lim}$ is the upper limit of a maximum measured battery voltage for a low specific gravity battery divided by the number of cells of the low specific gravity battery. When distinguishing between a higher SG battery and a lower SG battery, $SG_{Lim}$ represents the determination threshold voltage. For example, $SG_{Lim}$ is about 2.53 V, when distinguishing between a battery having an SG of 1.28 and a battery having an SG of 1.30. If $V_{pc} \leq SG_{Lim}$, the battery is determined to be the lower SG battery (1.28) as shown in 150. If $V_{pc} > SG_{Lim}$, the battery is determined to be the higher SG battery (1.30) as shown in 155.

If the number of gas points is not greater than zero in 130, then the SOC estimated in 120 can be compared to an SOC threshold value as depicted in 135. The SOC threshold represents the maximum state of charge for which gas points should not be detectable. For example, when testing batteries having a rated capacity of 25-100 amp hours (Ah), the SOC threshold value can equal 75% SOC. If the SOC determined in 120 is greater than the 75% SOC threshold, the battery is determined to be a higher value SG battery (1.30) in 155.

If the SOC determined in 120 is less than 75% of the SOC threshold, the battery SG cannot be immediately determined. The battery can be charged for a predetermined amount of time to increase the SOC, as depicted in 145. The predetermined amount of time can be determined by one of skill in the art. After charging, the method is repeated from 110.

Referring again to FIG. 1, once the SG is determined, an open circuit voltage of the battery can be determined at a rested state, as shown in 170. The rested state of the battery can be a period of inactivity of at least 30 minutes or more. In various embodiments, a set of open circuit voltage measurements can be made at the rested state. As used herein, the term "rested state open circuit voltage" refers to the open circuit voltage of the battery measured after the battery reaches a rested state where the battery voltage remains substantially constant. In various embodiments where the battery is not charged during SOC determination (Step 145 of FIG. 2), the rested state open circuit voltage can be determined by using a voltage measured at zero current during prior SOC determination (Step 120).

In step 180, the SOC of the battery can be determined using a correlation function that depends on the specific gravity of the lead-acid battery. For example, for a lower SG battery (1.28), the SOC can be determined by:

$$SOC_L = ((OCV \text{ per cell}/0.20) - 9.55) \times 100 \tag{1}$$

where $SOC_L$ is the state of charge of the lower specific gravity (1.28) battery measured as a percentage (%).

Similarly, the SOC of a higher SG battery (1.30) can be determined by:

$$SOC_H = ((OCV \text{ per cell}/0.12) - 16.75) \times 100 \tag{2}$$

where $SOC_H$ is the state of charge of the higher specific gravity (1.30) battery measured as a percentage (%).

Although the above-described exemplary embodiment distinguished between a lower specific gravity (1.28) battery and a higher specific gravity (1.30) to determine the SOC, one of skill in the art will understand that the exemplary methodology can be applied to batteries of other specific gravities once a correlation function is determined. According to various embodiments, a correlation function can be determined for a particular SG by, for example, bringing a battery of known SG, capacity, and acceptable state of health through a complete charge and discharge cycle, stopping at specific SOC intervals. An exemplary methodology for determining the correlation function will now be described using a lower specific gravity (1.28) battery and a higher specific gravity (1.30) battery as examples.

According to various embodiments, a lower specific gravity (1.28) battery and a higher specific gravity (1.30) battery of known performance capacity and acceptable state of health can be selected. In various embodiments, batteries with acceptable health can have no detectable defects. Further, in various embodiments, batteries with known capacity can be batteries with a measured discharge capacity from three consecutive discharges. The lower specific gravity (1.28) battery and the higher specific gravity (1.30) battery can be fully discharged to a defined cutoff voltage, such as, for example, 1.75 V per cell.

The batteries can then be brought through a complete charge and discharge cycle, stopping at predetermined SOC points. For example, the batteries can be cycled up and down at approximately 25% SOC intervals. The 25% SOC intervals can be determined by putting in charge equal in magnitude to capacity/4 during the charge portion of the cycle. Similarly, 25% SOC intervals can be determined by removing charge equal in magnitude to capacity/4 during the discharge portion of the cycle. Battery efficiency, a measure of the amount of energy that can be drawn from a battery versus the amount that can be put in, can be taken into account in aligning the SOC values in the charge and discharge portions of the cycle.

Figure 3:
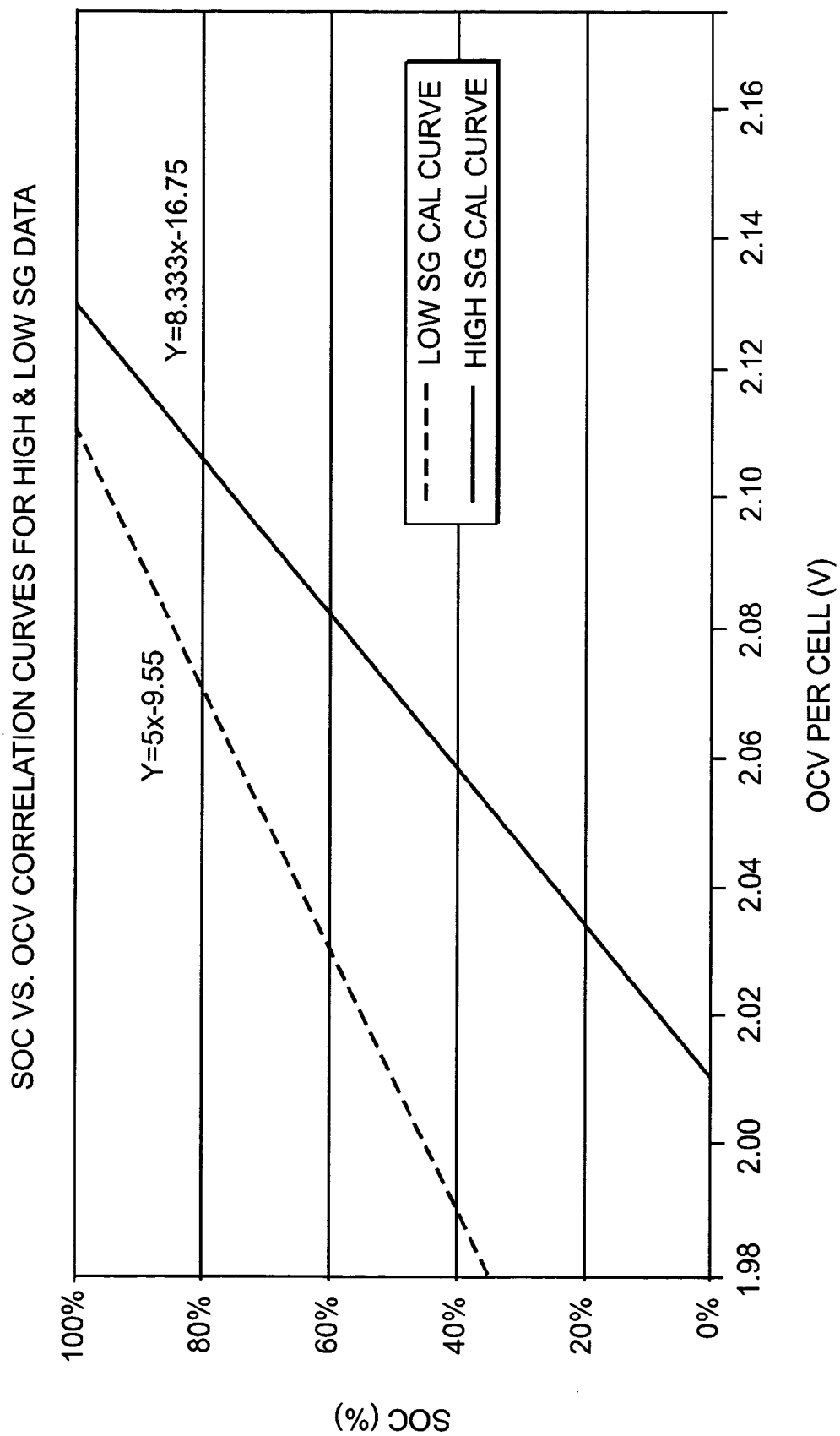
FIG. 3 is a graph showing the linear relationship between the open circuit voltage and SOC for a higher and a lower specific gravity battery.

As the batteries reach each predetermined SOC interval, the batteries can be allowed to reach a rested state before OCV measurements are taken. The rested state can be at least 30 minutes. Once OCV measurements have been taken at each of the SOC intervals of the charge and discharge cycle, curve fitting techniques can be used to determine a correlation function for each of the batteries. Because battery voltage can be a linear function of SOC, the curve fitting techniques can provide a first order correlation function that calculates SOC as a function of OCV. The correlation function can be an equation generally of the form shown in equation (3):

$$SOC = mx + c \quad (3)$$

where x is the open circuit voltage at a rested state, SOC is the state of charge, and m and c are constants. As shown in FIG. 3, the correlation function for the lower specific gravity (1.28) battery differs from the correlation function for the higher specific gravity (1.30) battery. One of ordinary skill in the art will understand that the disclosed methodology can be used to determine a correlation function for batteries having other specific gravities.

Figure 4:
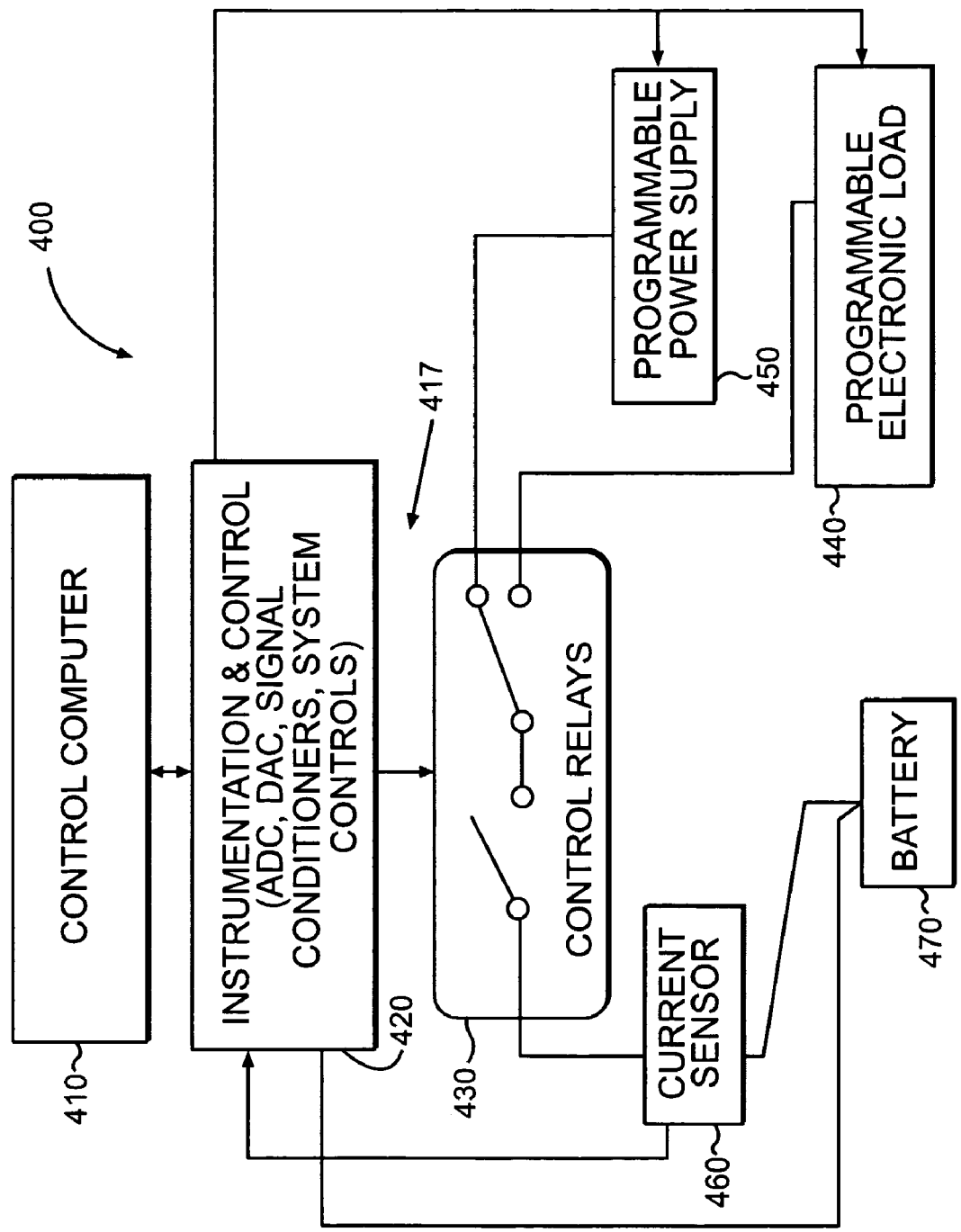
FIG. 4 depicts a block diagram of a system capable of determining the specific gravity and/or SOC of a battery in accordance with an exemplary embodiment.

FIG. 4 depicts an exemplary configuration of a system 400 that can determine the SG and/or the SOC of a battery. The exemplary system 400 can include various modules, such as a control computer 410, an instrumentation and control module 420, a control relay 430, an electronic load 440, a power supply 450, and a current sensor 460. Also shown in FIG. 4 is a battery 470, such as a lead-acid battery, for which SG and SOC are to be determined.

In various embodiments, control computer 410 can include a set of capacity measurements algorithms. Control computer 410 can also include any software drivers that can be used to control other modules of the exemplary system.

Control computer 410 can be connected to instrumentation and control module 420. Control computer 410 can be any suitable computer such as, for example, a Pentium® computer with a National Instruments data acquisition module installed therein. In various embodiments instrumentation and control module 420 can include an analog-to-digital converter (ADC), a digital-to-analog converter (DAC), and an electronic control signal generator (ECSG). Instrumentation and control module 420 can be, for example, a National Instruments signal conditioning system. The ADC processes information input into the instrumentation and control module 420 and coordinate with the DAC and ECSG to operate the other modules in system 400. For example, the ADC, the DAC, and the ECSG can control relay 430, electronic load 440, and/or power supply 450. Power supply 450 and electronic load 440 can both be programmable. Power supply 450 can be, for example, a Hewlett-Packard model 6032A power supply. Power supply 450, in conjunction with instrumentation and control module 420, can apply a current ramp, such as an increasing or decreasing current ramp of predetermined slopes, to battery 470. In various arrangements, power supply 450 and/or instrumentation and control module 420 can include computer software that controls the slope of the current ramp.

In various embodiments, control relay 430 can be used to connect battery 470, whose SOC is to be determined, to electronic load 440 and/or power supply 450. For example, instrumentation and control module 420 can control relay 430 by applying a contact closure control signal over a line 417 to switch battery 470 in and out of the circuit. When relay 430 is open, battery 470 is taken out of the circuit and no current is applied. When relay 430 is closed, battery 470 is in the circuit and a current can be applied. Current sensor 460, such as a current shunt, can be placed in series with battery 470. An exemplary current sensor 430 can include, for example, a 50-amp/50-millivolt shunt connected to a channel of the ADC. The 50-amp/50-millivolt shunt selection is exemplary of batteries where currents up to 50-amps may be encountered. The shunt selection can be performed to result in measurement sensitivity suitable for the battery being tested. Other suitable techniques can also be used to measure current, such as a Hall effect device. The sensed voltage, an analog quantity, can be converted to digital form by ADC in instrumentation and control module 110. The digital data of these parameters can be supplied to control computer 410. In this manner, current sensor 460 can be used to measure the amount of current going to, or coming from, battery 470. This can be performed by measuring the voltage drop across the current shunt and dividing the voltage drop by the shunt resistance. While electronic load 440 can be connected to battery 470, various embodiments of system 400 do not require the use of electronic load 440.

Various embodiments include a computer controllable medium. For example, embodiments can include a power supply control program that can control the amount of current supplied to the battery. The power supply control program can be stored in at least one of control computer 410, instrumentation and control module 420, electronic load 440, and power supply 450. The power supply control program can include subroutines that direct power supply 450 to apply an increasing current ramp to battery 470.

Various embodiments can include a current sensor program code to measure current using current sensor 460. The current sensor program code can be stored in at least one of control computer 410, instrumentation and control module 420, and current sensor 460. The current sensor program can direct current sensor 460 to measure the battery current. For example, when the power source program code directs power supply 450 to apply a current ramp, such as an increasing or decreasing current ramp, to battery 470, the current sensor program can direct current sensor 460 to measure the voltage drop across the current sensor 460. Information about the measured voltage drop can be analyzed by instrumentation and control module 420 to yield the battery current. Instrumentation and control module 420 can also determine the battery voltage directly by measuring the voltage across the positive and negative battery terminals.

Various embodiments include a processor control program that can determine a specific gravity and/or SOC of battery 470. The processor control program can be stored in at least one of control computer 410 and instrumentation and control module 420. The processor control program can receive information from electronic load 440, power supply 450, current sensor 460, and the battery 470. The received information can be processed and compared to diagram, such as, for example, FIG. 3, or used in a correlation function to determine the SOC of battery 470.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of determining a state of charge (SOC) of a lead-acid battery having an unknown specific gravity, the method comprising the steps of:

applying a current ramp to the battery while measuring battery voltage at terminals of the battery;

measuring presence of gas points during application of the current ramp;

determining a maximum voltage per cell ($V_{pc}$) for the battery;

estimating the SOC of the battery by applying a default low specific gravity of 1.28 having a known correlation curve;

when gas points are present, comparing the $V_{pc}$ to an upper limit of a maximum measured battery voltage, measured during the step of applying the current ramp to the battery, divided by a number of cells in the battery ($SG_{LIM}$);

when gas points are absent, comparing the estimated SOC to an SOC threshold value representing a maximum state of charge for which gas points should not be detectable;

determining a specific gravity of a lead-acid battery from one of the two comparing steps;

determining a rested state open circuit voltage of the lead-acid battery at a rested state; and determining the SOC of the lead-acid battery at a rested state from the rested state open circuit voltage using a correlation function, wherein the correlation function depends on the specific gravity of the lead-acid battery.

2. The method of claim 1, wherein the state of charge of a lead-acid battery at a rested state having a specific gravity of about 1.28 is determined by measuring the rested state open circuit voltage and using the correlation function:

$SOC = ((5 \text{ times rested state } OCV \text{ per cell}) - 9.55 \times 100$.

3. The method of claim 1, wherein the state of charge of a lead-acid battery at a rested state having a specific gravity of about 1.30 is determined by measuring the rested state open circuit voltage and using the correlation function:

$SOC = ((8.333 \text{ times rested state } OCV \text{ per cell}) - 16.75) \times 100$.

4. The method of claim 1, further comprising determining the correlation function for a lead-acid battery by applying a complete charge/discharge cycle to the lead-acid battery comprising the steps of:

discharging or charging the lead-acid battery to a predetermined cutoff voltage;

charging or discharging the lead-acid battery to a plurality of predetermined state of charge intervals; and measuring the rested state open circuit voltage of the lead-acid battery at a rested state during charging or discharging at each of the plurality of predetermined state of charge intervals.

5. The method of claim 4, wherein the plurality of predetermined state of charge intervals is determined by dividing a battery capacity by an integer.

6. The method of claim 1, wherein the rested state is a period of inactivity of at least 30 minutes or more.

7. The method of claim 4, further comprising plotting an absolute value of each of the rested state open circuit voltage measurements at each of the plurality of predetermined state of charge intervals.

8. The method of claim 4, further comprising using curve-fitting techniques to derive the correlation function from the plot of the absolute value of each of the rested state open circuit voltage measurements at each of the plurality of predetermined state of charge intervals.

9. The method of claim 4, wherein the correlation function is derived for a battery having a known or unknown specific gravity.

10. The method of claim 1, further comprising the step of determining the unknown specific gravity of the battery to identify the correlation function for use with a plurality of batteries having that specific gravity.

11. The method of claim 1, wherein:

if $V_{pc} \leq SG_{Lim}$, the battery is determined to have the default low specific gravity; and if $V_{pc} > SG_{Lim}$, the battery is determined to have a specific gravity higher than the default low specific gravity.

12. The method of claim 1, wherein:

if the estimated SOC is less than or equal to the SOC threshold value, then the battery has the default low specific gravity; and if the estimated SOC is greater than the SOC threshold, the battery has a specific gravity higher than the default low specific gravity.

* * * * *